(12) United States Patent
Bowen et al.

(10) Patent No.: US 9,390,204 B2
(45) Date of Patent: Jul. 12, 2016

(54) MULTISEGMENT FRACTURES

(71) Applicant: Schlumberger Technology Corporation, Sugar Land, TX (US)

(72) Inventors: Garfield Bowen, Oxfordshire (GB); Terry Wayne Stone, Hampshire (GB); David C. Bradley, Navi Mumbai (IN); Nikolay Morozov, Oxford (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 389 days.

(21) Appl. No.: 13/728,729

(22) Filed: Dec. 27, 2012

(65) Prior Publication Data

US 2013/0124178 A1     May 16, 2013

Related U.S. Application Data

(63) Continuation-in-part of application No. 13/034,737, filed on Feb. 25, 2011, now Pat. No. 8,682,628.

(60) Provisional application No. 61/358,101, filed on Jun. 24, 2010.

(51) Int. Cl.
*G06G 7/48* (2006.01)
*G06F 17/50* (2006.01)
*E21B 43/26* (2006.01)

(52) U.S. Cl.
CPC ............ *G06F 17/5009* (2013.01); *E21B 43/26* (2013.01)

(58) Field of Classification Search
CPC ................ E21B 43/26; G06F 17/5018; G01V 2210/1234; G01V 2210/624; G01V 2210/64; G01V 2210/646; G01V 2210/6246; G01V 2210/644

USPC .................................................. 703/10; 702/6
See application file for complete search history.

(56) References Cited

U.S. PATENT DOCUMENTS

| 6,928,399 | B1 | 8/2005 | Watts, III et al. |
| 8,204,727 | B2 | 6/2012 | Dean et al. |
| 8,392,165 | B2 | 3/2013 | Craig et al. |
| 8,521,494 | B2 | 8/2013 | Narr et al. |
| 2003/0216898 | A1 | 11/2003 | Basquet et al. |
| 2008/0133186 | A1 | 6/2008 | Li et al. |
| 2009/0006057 | A1 | 1/2009 | Yuqiang et al. |
| 2009/0164189 | A1* | 6/2009 | Bourbiaux ...................... 703/10 |

(Continued)

OTHER PUBLICATIONS

Warren et al. (1963), "The Behavior of Naturally Fractured Reservoirs", SPE Journal, vol. 3, No. 3, pp. 245-255 (11 pages).

(Continued)

*Primary Examiner* — Eunhee Kim
(74) *Attorney, Agent, or Firm* — Colin L. Wier; Rodney Warfford; Alec McGinn

(57) ABSTRACT

A method can include identifying a discrete natural fracture in a three-dimensional environment that includes a reservoir modeled by a three-dimensional grid model, representing the discrete natural fracture via a multisegment model in a two-dimensional region within the three-dimensional grid model, defining at least one connection for fluid communication between the multisegment model and the three-dimensional grid model, defining boundary conditions for the multisegment model, and solving the multisegment model subject to the at least one connection and the boundary conditions to provide values for fluid flow in the two-dimensional region. Various other apparatuses, systems, methods, etc., are also disclosed.

19 Claims, 12 Drawing Sheets

(56) References Cited

U.S. PATENT DOCUMENTS

| | | |
|---|---|---|
| 2009/0210174 A1 | 8/2009 | Stone et al. |
| 2010/0004906 A1* | 1/2010 | Searles et al. .................. 703/2 |
| 2010/0076738 A1 | 3/2010 | Dean et al. |

OTHER PUBLICATIONS

Gale et al. (2007), "Natural fractures in the Barnett Shale and their importance for hydraulic fracture treatments", AAPG Bulletin, V. 91, No. 4, pp. 603-622 (20 pages).

"INTERSECT Next-Generation Reservoir Simulation Software" (2010), Schlumberger Limited, Houston, TX (2 pages).

Afilaka et al. (2001), "Improving the Virtual Reservoir", Oilfiled Review, Spring 2001: 13, No. 1, pp. 26-47 (22 pages).

"PEMEX Achieves Faster, More Detailed Simulations" (2012), Schlumberger Limited, Houston, TX (2 pages).

"INTERSECT 2012" (2012), Schlumberger Limited, Houston, TX (4 pages).

Cipolla C. L., Lolon E. P., Mayerhofer, M. J., "Reservoir Modeling and Production Evaluation in Shale-Gas Reservoirs," IPTC 13185 presented at the International Petroleum Technology Conference, Doha, Qatar, Dec. 7-9, 2009, pp. 1-15.

Cokar M., Kallos, M. S., Gates I. D., "Reservoir Simulation of Steam Fracturing in Early Cycle Cyclic Steam Stimulation," SPE 129686 presented at the 2010 SPE Improved Oil Recovery Symposium, Tulsa, Oklahoma, USA, Apr. 24-28, 2010, pp. 1-19.

Holmes, J. A., Barkve, T., and Lund, 0., "Application of a Multisegment Well Model to Simulate Flow in Advanced Wells," SPE 50646 presented at the SPE European Petroleum Conference, The Hague, The Netherlands, Oct. 20-22, 1998, pp. 1-11.

Holmes J. A., Byer T., Edwards D. A., Stone T. W., Pallister I., Shaw G., Walsh D., "A Unified Wellbore Model for Reservoir Simulation," SPE 134928 to be presented at the SPE Annual Technical Conference and Exhibition, Florence, Italy, Sep. 19-22, 2010, pp. 1-14.

Huskey W. L., Crawford P. B., "Performance of Petroleum Reservoirs Containing Vertical Fractures in the Matrix," Society of Petroleum Engineers Journal, Jun. 1967, pp. 221-228.

Koehler M., "Productivity of Frac Stimulations in the German Rotliegend: Theoretical Consideration and Practical Results," SPE 94250 presented at the SPE EUROPECTEAGE Annual Conference, Madrid, Spain, Jun. 13-16, 2005, pp. 1-14.

Neylon, K., Reiso, E, Holmes, J. A. and Nesse, 0. B., "Modeling Well Inflow Control with Flow in Both Annulus and Tubing," SPE 118909 presented at the 2009 SPE Reservoir Simulation Symposium, The Woodlands, Texas, USA, Feb. 2-4, 2009, pp. 1-13.

Prats M., "Effect of Vertical Fractures on Reservoir Behavior—Incompressible Fluid Case," SPE 1575-G and Society of Petroleum Engineers Journal, 106-118, Jun. 1961,pp. 105-118.

Stone, T. W., Bennett, J., Law, D.H.-S. and Holmes, J.A., "Thermal Simulation With Multisegment Wells," SPEREE 5 (3):206-218, and SPE 66373 presented at the SPE Reservoir Simulation Symposium, Houston, Texas, 11-4 Feb. 2001, pp. 1-13.

Stone T. W., Naccache P., Neylon K., Edwards D., Damas C. E. P., Rowan D., "Dynamic and Static Thermal Well Flow Control Simulation," SPE 130499 presented at the SPE EUROPEC/EAGE Annual Conference and Exhibition, Barcelona, Spain, Jun. 14-17, 2010, pp. 1-9.

Van Poollen H. K., "Productivity vs Permeability Damage in Hydraulically Produced Fractures," Drill. and Prod. Prac., API, 103, 1957, pp. 103-110.

Van Poollen H. K., Tinsley J. M., Saunders C. D., "Hydraulic Fracturing: Fracture Flow Capacity vs Well Productivity," Trans., AIME, vol. 213, 91, 1958, pp. 91-95.

Downey, R., "e-Field: Efficient, Intelligent Operations for Field Development," TIPRO's 61st Annual Convention, Austin, TX, Feb. 28-Mar. 2, 2007 (attached as Rich Downey Presentation, SLB—included for background and GUIs).

Schlumberger, 2009. ECLIPSE Technical Reference Manual, 2009, Chapter 16—Dual Porosity, Chapter 42—Multi-segment Wells, and Chapter 76—Well Inflow Performance, 150Pages.

U.S. Appl. No. 61/162,962, filed on Mar. 24, 2009, related U.S. Pat. No. 2010/0250216 A1 to Narr.

Wallis, Incomplete Gaussian Elimination as a Preconditioning of Generalized Conjugate Gradient Acceleration, SPE 12265, SPE Reservoir Simulation Symposium, San Francisco, CA, Nov. 15-18, 1983.

French Patent Application No. 1362572, Office Action dated Apr. 14, 2014.

French Patent Application No. 11/52755, Notice of Allowance dated Jan. 22, 2015, pages.

Mun-Hong Hui, et al, "An Innovative workflow to model fractures in a giant carbonate reservoir" IPTC 12572, International Petroleum Conference, Dec. 3-5, Kuala Lumpur, Malaysia 2008, 13 pages.

\* cited by examiner

MULTISEGMENT FRACTURES

RELATED APPLICATIONS

This application is a continuation-in-part of U.S. patent application having Ser. No. 13/034,737, filed Feb. 25, 2011, now issued as U.S. Pat. No. 8,682,628, entitled "Multiphase Flow in a Wellbore and Connected Hydraulic Fracture," which is incorporated by reference herein and which claims the benefit of U.S. Provisional Patent Application having Ser. No. 61/358,101, filed Jun. 24, 2010, entitled "Multiphase Flow in a Wellbore and Connected Hydraulic Fracture, "which is incorporated by reference herein.

BACKGROUND

Natural fractures may provide for fluid storage, fluid flow, etc. Modeling of natural fractures may facilitate understanding of fluid storage, fluid flow, etc. Various techniques described herein pertain to modeling fractures.

SUMMARY

A method can include representing a discrete natural fracture via a multisegment model in a two-dimensional region within a three-dimensional grid model, defining at least one connection for fluid communication between the multisegment model and the three-dimensional grid model, defining boundary conditions for the multisegment model, and solving the multisegment model subject to the at least one connection and the boundary conditions to provide values for fluid flow in the two-dimensional region. A system can include a processor for processing information and memory to store modules such as a reservoir module for modeling a reservoir in a subterranean three-dimensional environment via a three-dimensional grid model, a natural fracture module for modeling a natural fracture via a multisegment model in a two-dimensional region, and a solver module for solving for values of fluid flow in a fracture network based at least in part on modeling a natural fracture via a multisegment model. Computer-readable storage media can include computer-executable instructions to instruct a computing system to grid a natural fracture region using multiple segments positioned with respect to a three-dimensional grid model, solve a system of equations associated with the multiple segments to provide a solution, introduce the solution as input to a system of equations associated with the three-dimensional grid model and solve the system of equations associated with the three-dimensional grid model.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
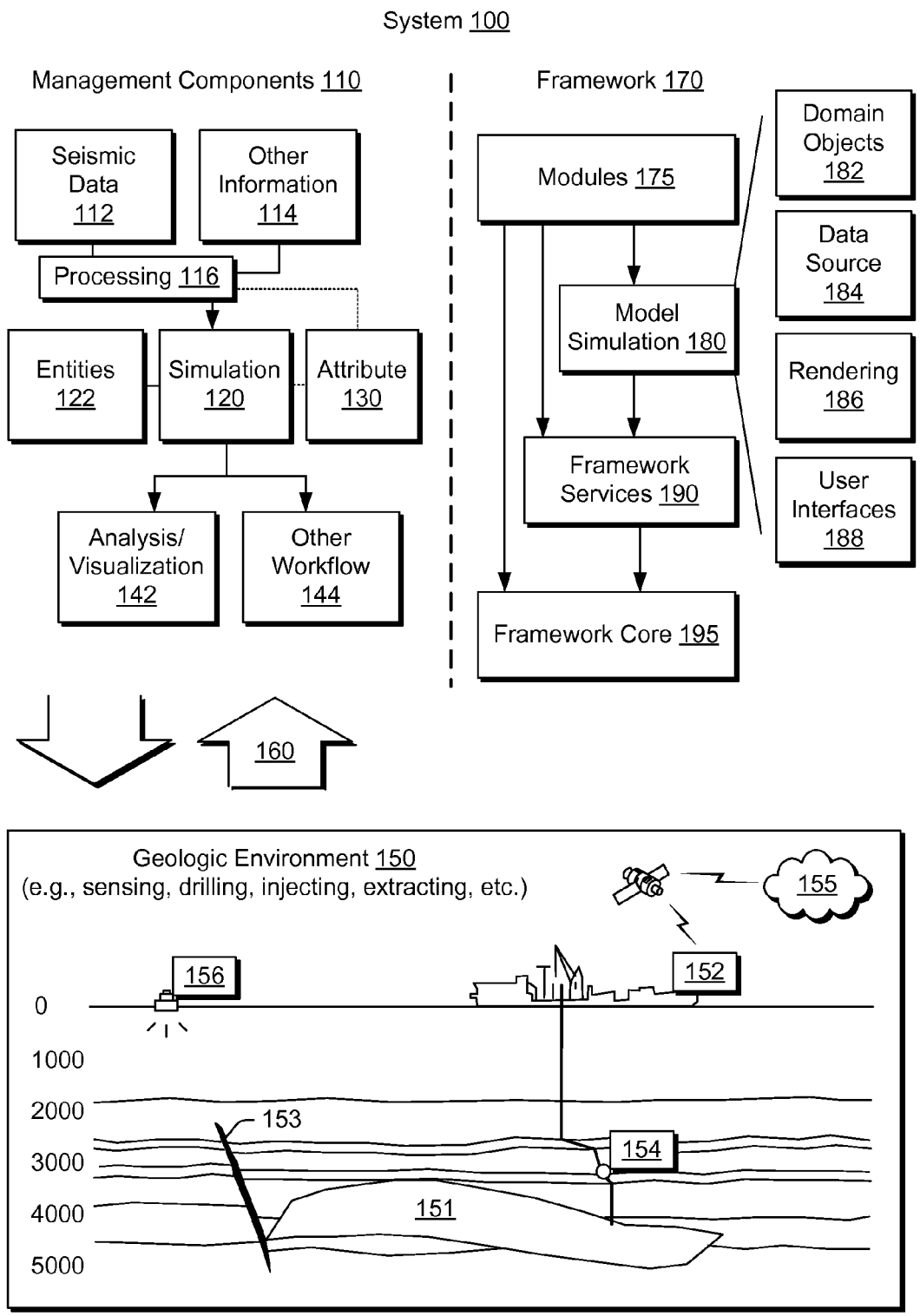
FIG. 1 illustrates an example system that includes various components for modeling a geologic environment.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Natural fractures can provide for fluid storage, fluid flow, etc. As an example, a fluid reservoir may exist in a subterranean formation that includes natural fractures. Fluid may extend from the fluid reservoir into natural fractures that intersect the fluid reservoir. In some instances, for a subterranean formation, more fluid may reside in natural fractures intersecting a reservoir than in the reservoir itself (e.g., consider oil reserves in a large carbonate field).

As an example, a naturally fractured reservoir can include a rock matrix along with a set of natural fractures. In such an example, the rock matrix may be described by various properties (e.g., lithology properties, fluid properties, etc.). Natural fractures may include those formed due to stress, strain, etc., for example, due to forces associated with plate-tectonic activity. Where multiple natural fractures have been propagated in a formation, they may form natural fracture networks, which, for example, can contribute to storage (e.g., via porosity) and fluid flow (e.g., via permeability, transmissibility, etc.). As to fluid production from such a reservoir, natural fractures may provide for comparatively fast fluid flow and may be present at various length scales from relatively small (e.g., of the order of meters or less) to a scale comparable to one or more dimensions of the reservoir. As an example, larger fractures may form "fracture corridors", which may be, for example, identified and mapped for a formation (e.g., based on seismic data, interpretation of seismic data, etc.).

With respect to smaller length natural fractures (e.g., of a distribution of natural fractures), as an example, those below a resolution of a reservoir simulation may be simulated using a continuum approach (e.g., using one or more types of porosity models such as a dual-porosity model). For larger natural fractures (e.g., of a distribution of natural fractures), for example, those having a dimension greater than a dimension of a reservoir model, such natural fractures may be modeled using fracture representations that can be mathematically linked to the reservoir model. For example, a workflow may include adding natural fracture representations to an existing model of a rock matrix coupled with a solution technique to effectively solve the resulting coupled set of equations for modeling flow, etc. In such an example, the fracture representations may be dimensionless in a dimension with respect to a dimension within an existing geological model. As an example, a workflow may include parameterizing one or more natural fracture representations without gridding (e.g., without modifying an existing geological model grid) the one or more fracture representations at a geological scale. Such an approach may reduce conditioning demands for a geological model while offering an opportunity to accurately represent characteristics such as storage, flow, etc., of the one or more natural fractures.

As an example, natural fractures may be characterized at least in part by orientation and size (e.g., optionally in two dimensions with a dimensionless third dimension). As an example, a natural fracture may be characterized in part by a length/width aspect ratio, which may be greater than 100:1. Natural fractures may exist in clusters, for example, spaced several hundred feet apart along a general direction (e.g., orientation). Such natural fractures may enhance permeability locally and may be beneficial or detrimental to techniques to enhance recovery. For example, natural fractures may act to relieve pressure applied during a wellbore hydraulic fracturing process that aims to create artificial fractures. In such an example, fewer artificial fractures may be created, lesser volume artificial fractures may be created, etc. Further, a mixed or hybrid network may be created that includes both artificial and natural fractures. As an example, where a natural fracture is "dry", fluid may flow from an artificial fracture to the natural facture, which may be beneficial or detrimental depending on what type of fluid is flowing, location of the natural fracture, etc. As an example, a hydraulic fracturing process may "reactivate" a natural fracture (or natural fractures). Where reactivation promotes flow of an undesirable fluid (e.g., water), recovery of a desirable fluid or fluids may be impacted (e.g., as to recovery, processing, etc.). As an example, reactivation of a natural fracture or natural fractures may be beneficial and improve efficiency of a fracturing process.

As an example, modeling of a natural fracture may enhance decision-making based on determinations as to whether the natural fracture is beneficial or detrimental to a particular goal or goals. For example, if a natural fracture stores a certain amount of a desired fluid (e.g., a substantial amount), modeling may enhance decision-making as to where a producer well and an injector well may be positioned to recover at least a portion of the desired fluid from the natural fracture (e.g., consider modeling flow due to applied pressure, breakthrough, recovery of desired fluid, etc.). As another example, if a natural fracture is substantially void of a desired fluid, a recovery process may aim to avoid creation of any paths that could cause flow of the desired fluid from another store (e.g., a fluid reservoir, a filled fracture, etc.) to that natural fracture. As yet another example, if a natural fracture stores an undesirable fluid, a recovery process for a desired fluid may aim to avoid creation of any paths that could cause mixing of the undesired fluid and the desired fluid.

As an example, a natural fracture may be characterized with respect to a reservoir (e.g., with respect to a recovery process such as hydraulic fracturing). As another example, a natural fracture may be characterized with respect to a chemical process such as acidizing (e.g., a process that includes introducing an acidic material into a natural fracture in a carbonate field to enlarge, extend, etc., the natural fracture). Characterization of a natural fracture may include a characterization that is beneficial, detrimental, or neutral with respect to one or more goals.

As an example, permeability in a fracture can be greater than in material surrounding the fracture. As mentioned, fractures may be natural or artificial. An artificial fracture may be made, for example, by injecting fluid into a wellbore to increase pressure in the wellbore beyond a level sufficient to cause fracture of a surrounding formation or formations. In such an example, an artificial fracture is in fluid communication with the wellbore. Thus, an artificial fracture may generally be viewed as being part of a network that includes a wellbore. As to chemical processes such as acidizing, such a process may be applied to a natural fracture or an artificial fracture (e.g., a hydraulic fracture). Acidizing may be considered to be a stimulation operation in which acid (e.g., hydrochloric acid), is injected into a formation (e.g., carbonate formation) such that the acid etches fracture faces to form conductive channels. As an example, hydrochloric acid may be introduced into a fracture in a limestone formation to react with the limestone to form calcium chloride, carbon dioxide and water. As another example, consider a dolomite formation where magnesium chloride is also formed. Acids other than hydrochloric acid may be used (e.g., hydrofluoric acid, etc.). As an example, a mixture of acids may be used.

As to pressure fracturing, pressure to fracture a formation may be estimated based in part on a fracture gradient for the formation (e.g., kPa/m or psi/foot). As an example, techniques to make fractures may involve combustion or explosion (e.g., combustible gases, explosives, etc.). As to hydraulic fractures, injected fluid (e.g., water, other fluid, mixture of fluids, etc.) may be used to open and extend a fracture from a wellbore and may be used to transport a proppant throughout a fracture. A proppant may include sand, ceramic or other particles that can hold fractures open, at least to some extent, after a hydraulic fracturing treatment (e.g., to preserve paths for flow, whether, for example, from a wellbore to a reservoir or vice versa).

Artificial fractures may be oriented in any of a variety of directions, which may be, at least to some extent, controllable (e.g., based on wellbore direction, size and location; based on pressure and pressure gradient with respect to time; based on injected material; based on use of a proppant; based on existing stress; etc.).

Hydraulic fracturing may be particularly useful for production of natural gas as well as for production of so-called unconventional natural gas. A larger percentage of worldwide reserves of unconventional natural gas may be categorized as undeveloped resources. Reasons for lack of production from such reserves can include an industry focus on producing gas from conventional reserves and difficulty of producing gas from unconventional gas reserves. Unconventional gas reserves may be characterized by low permeability where gas has difficulty flowing into wells without some type of assistive efforts. For example, one way to assist gas flow from an unconventional reservoir can involve hydraulic fracturing to increase overall permeability of the reservoir.

Subterranean formations, and related physical phenomena, may be modeled using various techniques. Such techniques can involve gridding, or other discretization, of one or more subterranean volumes that make up a formation. Where a formation includes one or more fluids (e.g., gas, liquid, or both), a modeling technique may also include formulating equations that account for physical phenomena such as pressure, saturation and composition. As an example, consider an oil and gas field that spans a volume measured in kilometers. A model of such a field may include many thousands of grid cells or grid points where each cell or point has associated pressure, saturation and composition values, which may be equation unknowns, for example, optionally with respect to time. Given initial values (e.g., initial conditions) and boundary values (e.g., boundary conditions), an iterative solution technique may be applied to the model equations to determine the equation unknowns at one or more points in time (e.g., steady-state or transient).

As mentioned, a fracture may be characterized according to an aspect ratio. As an example, a fracture may include a length/width aspect ratio greater than about 1000:1. As an example, a fracture may include a width of the order of about a centimeter and a length of the order of about a hundred meters or more. With respect to modeling such a fracture with grid cells or grid points, many of such grid cells or grid points may be involved due to the scale of the fracture. Accordingly, for a simulation, the number of unknowns may increase, which, in turn, can increase computation demands.

As an example, a fracture may be modeled using multiple connected segments. As an example, a segment may be defined as including properties to characterize a natural fracture. For example, a segment may be defined as including properties that correspond to a dual porosity model or "Darcy" model (e.g., for flow in a permeable medium driven by a pressure gradient). As an example, a reservoir (e.g., a naturally fractured reservoir, a vugular carbonate reservoir, etc.) may be classified as a dual-porosity reservoir (e.g., a reservoir that includes high-permeability regions and low-permeability regions).

As an example, a fracture model may be defined using segments and associated equations for storage, flow, etc., for example, to or from a reservoir. In such an example, a reservoir model may be defined using grid cells that account for various geophysical features (e.g., faults, horizons, etc.).

As an example, a segment for modeling a portion of a natural fracture may be defined by a segment "pipe" and a node. As an example, sources, sinks, etc., may be "connected" to one or more segments that model a natural fracture. For example, consider a reservoir as a source or sink in fluid communication with a natural fracture. As an example, a model of a natural fracture may include mathematical connections to one or more grid cells of a reservoir model. As an example, for modeling storage, flow, etc., in a fracture, a segment may be associated with equations to model multiphase fluid in a porous medium. For example, such equations may describe a Darcy flow model for each phase flow (e.g., a Darcy flow model for phase pressure drop with additional independent variables for each phase molar rate).

As mentioned, a reservoir model may include a three-dimensional grid (e.g., a spatial grid) that can be iterated over time (e.g., temporally, to provide a four-dimensional model). As an example, a reservoir may span hundreds of square kilometers and be located kilometers in depth. The expansive nature of such a reservoir may bring various types of physical phenomena into play. Such phenomena may exhibit macroscale, microscale or a combination of macro- and microscale behavior. Attempts to capture microscale phenomena via increased reservoir grid density or grid densities can result in an increase in computational and other resource demands. For example, increasing two-dimensional grid density by decreasing grid block spacing from 10 meters by 10 meters to 5 meters by 5 meters can increase computational demand significantly (e.g., a four-fold increase). Thus, some tradeoffs may exist between modeling microscale features and resource demands.

Modeling fractures with grid blocks that approximate fracture geometry (e.g., possibly less than about a couple of centimeters) may result in grid blocks that tend to be smaller in thickness than surrounding grid cells. In such an approach, size disparity may lead to inaccuracies in simulation, instabilities and small timesteps. As an example, a multisegment approach to modeling fractures may be used, for example, without resorting to introduction of grid blocks that may give rise to size disparity issues. As an example, a multisegment approach to modeling one or more fractures may be followed by a grid approach, for example, where results of the multisegment approach inform the grid approach. Such an example may enhance a grid approach, for example, by refining orientation, location, etc., of a natural fracture using a multisegment approach.

As an example, a method may include multisegment modeling of fluid communication between: (i) one or more natural fractures and a reservoir; (ii) one or more natural fractures and one or more artificial fractures; (iii) one or more natural fractures and one or more wellbores; (iv) one or more artificial fractures and a reservoir; (v) one or more artificial fractures and one or more wellbores. In such an example, combinations may be modeled such that a multisegment model models indirect fluid communication between different types of entities. For example, an artificial fracture may be modeled via a multisegment model to be in fluid communication with a reservoir via a natural fracture. As mentioned, depending on the process implemented to create an artificial fracture, it may be inherently in fluid communication with a wellbore (e.g., via a wellbore where pressure has been applied to create the artificial fracture).

As an example, a multisegment model may include different types of segments. For example, a segment may be provided that can characterize injecting or producing performance relations (e.g., a segment associated with equations that describe multiphase fluid flow entering into or exiting out of a wellbore). As another example, a segment may be provided that can characterize multiphase fluid flow in a porous medium (e.g., equations that can describe a Darcy flow model for each phase flow). As an example, a segment may be provided that can characterize a chemical process, a pressure process, etc., that may act on a formation (e.g., acidizing, fracturing, etc.).

As an example, a solution technique can include solving a system of non-linear equations for a multisegment model that models one or more natural fractures. A solution to such a model can, in turn, be a component of an overall reservoir non-linear solution procedure. For example, an overall reservoir solution procedure may utilize a converged solution of a multisegment model that models one or more natural fractures.

As an example, a multisegment model can include discretizing and parameterizing one or more fracture corridors with respect to a reference system that can enhance flexibility in representation and calculation efficiency of a field wide fractured reservoir model. As an example, a multisegment model may leverage capabilities of a well model specification associated with a simulation framework. For example, the INTERSECT™ framework (Schlumberger Limited, Houston, Tex.) includes a well model specification that specifies segments for creating a multisegment well model. In such an example, a "well" segment may be adapted to model a natural fracture, for example, by providing one or more appropriate boundary conditions. As an example, a boundary condition may be applied to a "well" segment that avoids a direct connection of that segment to the surface via a wellbore such that the "well" segment can be used to model a natural fracture. Further, a well model specification may include a type of segment for connecting a well segment to a reservoir where that segment models a porous matrix rather than a conduit (e.g., a wellbore). As an example, a natural fracture may be modeled using porous matrix segments (e.g., Darcy segments) with appropriate boundary conditions (e.g., no direct flow to the surface, etc.).

As an example, a single natural fracture, multiple natural fractures (e.g., optionally as a natural fracture corridor) may be represented as a two-dimensional "grid" or multisegment network. In such an example, a 2D grid that represents a natural fracture may be described as multiple segments specified according to equations for a porous medium (e.g., Darcy segments).

As an example, a method can include solving equations for individual natural fractures in a nested fashion relative to a reservoir model grid, which may provide a more robust solution than an approach that involves the natural fracture equations being solved concurrently with those of the reservoir model grid.

As an example, a method can include locating one or more 2D grids with respect to a pre-existing grid (e.g., a reservoir model grid). In such an example, a 2D grid, for example, lacking a thickness (e.g., dimensionless in one dimension), may be inserted (e.g., mathematically) into a pre-existing grid along a grid line, or it may be inserted using a process that includes grid cell division for pre-existing grid cells intersected by the 2D grid. Such a process may place fewer demands than a process that aims to represent a natural fracture with its thickness, which may involve introducing grid cells into the pre-existing grid where the introduced grid includes a dimension smaller than that of the pre-existing grid of the region where the grid is to be inserted.

As an example, a "well" model adapted to model a natural fracture may be run with a flow boundary condition with a zero rate, which may act to link a 2D grid of a multisegment natural fracture to a reservoir grid.

As an example, a system may provide for modeling one or more fracture corridors using a multisegment approach along with using a continuum dual porosity approach (e.g., for a subterranean region) to create a representative hybrid model, for example, where major fracture corridors can be modeled explicitly using the multisegment approach and an associated micro-fracture system can be represented by a dual (or multiple) porosity characterization model.

As to workflow, a reservoir engineer may commence modeling of a reservoir while having some information about very large scale fracture features (e.g., from seismic data, well testing, well logging, etc.); however, the reservoir engineer may have little information and hence uncertainty about fractures or micro-fractures that are too small to identify, which may have a material influence on storage, flow, etc. As a fracture system may affect long term reservoir performance, in performing a workflow, the reservoir engineer may attempt to utilize multiple simulation models in an effort to understand impact of reservoir uncertainties and variance in the characterization of the fracture system within the measurement tolerances on the production and recovery performance of the field.

As an example, given a system that includes modules for implementing a multisegment model for one or more natural fractures, a reservoir engineer may perform a workflow that includes mapping natural fractures using available information to a map and modeling natural fractures of the map using a multisegment model. Further, the reservoir engineer may optionally perform a workflow that includes mapping one or more alternative natural fracture maps (e.g., maps that may encompass possible alternative characterizations). As an example, a workflow may include one or more of a base unfractured case, fracture maps and their resultant fracture representations, which may be added to a simulator to allow for simulation. In such an example, where well performance is predicted and historical data exist, predicted well performance may be compared to the historical data.

Where a computationally stable base unfractured case exists for a reservoir grid model, as an example, a method can include introduction of 2D grids that represent natural fractures. In such an example, 2D grids may be introduced in series or in parallel to vary intensity and conductivity of fractures. As such an approach may avoid regridding of the base unfractured case reservoir grid model and allow for examination of the effect of a given fracture or fracture set while having some assurances that the underlying base case remains stable. As an example, a multisegment approach to modeling natural fractures can enhance convenience, flexibility and resolution of impact and sensitivity of fracture storage, flow, etc. on reservoir performance, recovery, etc. As an example, a multisegment approach to modeling natural fractures can enhance understanding of well placement, hydraulic fracturing, fluid injection, chemical treatment, etc., which may relate to one or more goals (e.g., production of a desired fluid).

FIG. 1 shows an example of a system 100 that includes various management components 110 to manage various aspects of a geologic environment 150 (e.g., an environment that includes a sedimentary basin, a reservoir 151, one or more fractures 153, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may rely on a software framework such as an object-based framework. In such a framework, entities may include entities based on pre-defined classes to facilitate modeling and simulation. A commercially available example of an object-based framework is the MICROSOFT® .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results. As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a reservoir or reservoirs may be simulated with respect to one or more enhanced recovery techniques (e.g., consider a thermal process such as SAGD, etc.).

In an example embodiment, the management components 110 may include features of a commercially available simulation framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of simulating a geologic environment).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc.

Figure 2:
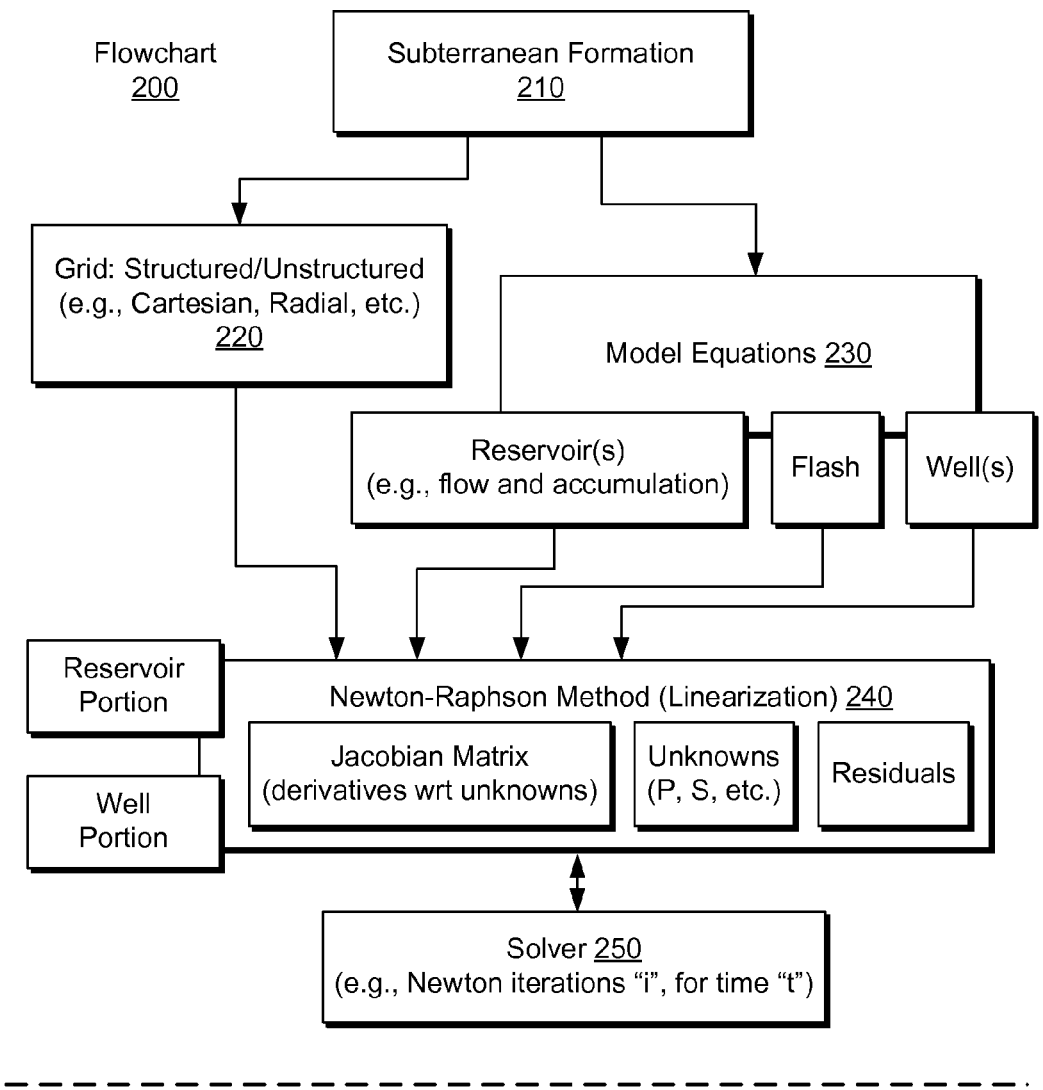
FIG. 2 illustrates an example of a flowchart that includes a solver for solving a system of equations and an example of a multisegment well model.
Figure 2:
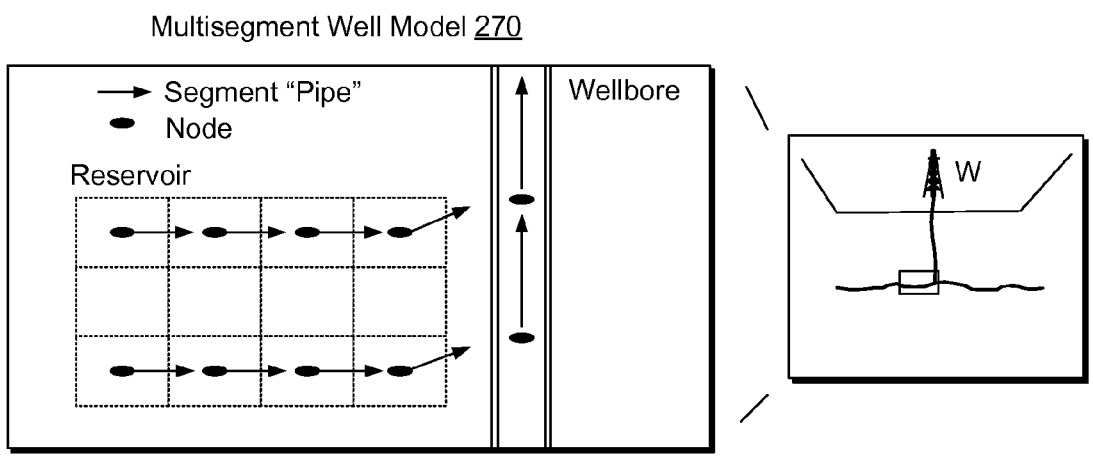

As mentioned, the simulation component 120 of FIG. 1 may include one or more features of a simulator such as the ECLIPSE™ reservoir simulator, the INTERSECT™ reservoir simulator, etc. FIG. 2 shows a flowchart 200 of an example of a process for simulating physical phenomena associated with a subterranean formation 210, which may be, for example, a portion of the geologic environment 150 of FIG. 1 or other geologic environment. FIG. 2 also shows an example of a multisegment well model 270, which may provide for modeling of wells in the subterranean formation 210.

In the example of FIG. 2, a grid block 220 provides for gridding a surface, a volume, etc., to represent the subterranean formation 210 while a model block 230 provides equations for modeling physical phenomena associated with the subterranean formation 210. The equations of the model block 230 may be discretized or otherwise described with respect to one or more grids as provided by the grid block 220 (e.g., structured, unstructured, structured and unstructured).

As an example, equations may be solved to describe how values of dependent variables such as pressure (e.g., including capillary pressure, temperature, saturation, mole fraction (e.g., liquid mole fraction, vapor mole fraction, aqueous mole fraction, etc.) and mass rate (e.g., via mass conservation equations) can change with respect to time. Equations may include various property related terms, for example, porosity, pore volume, viscosity, mass density, gravity density and permeability. As an example, equations may be formulated with respect to molar flow (e.g., to provide values that readily illustrate phenomena such as reaction conversion and stoichiometry).

As an example, reservoir simulation can involve numerical solution of a system of equations that describes the physics governing certain behaviors of multi-component, multiphase fluid flow in porous media of a subterranean reservoir. A system of equations may be formulated as coupled nonlinear partial differential equations (PDEs). Such PDEs may be discretized spatially and optionally temporally with respect to one or more grids. Systems of equations may be solved for unknowns via an iterative process. As an example, iterations may occur for a series of time steps until a prescribed time is reached.

In the example of FIG. 2, a linearization block 240 provides for linearization of a system of equations such as those provided by the model block 230. For example, linearization of a nonlinear system of equations may occur using a Newton-Raphson method that involves formation of a Jacobian matrix of derivatives with respect to various unknowns. As an example, the subterranean formation 210 may be, or planned to be, intersected with one or more wells. In such an example, a system of equations may include a reservoir portion and a well portion. With respect to ordering of equations that describe such portions, the introduction of the well portion may impact one or more of ordering, matrix size, etc., compared to a system of equations that accounts for a reservoir without one or more wells. For example, a reservoir portion may result in a diagonally structured Jacobian matrix (e.g., with some diagonal band-width) while a well portion may result in addition of borders to the diagonally structured Jacobian matrix.

As an example, unknowns may include pressure "P" unknowns and saturation "S" unknowns. For example, one or more grids may be imposed upon an area of interest in a reservoir model to define a plurality of cells, each having one or more unknown properties associated therewith. Examples of unknown properties can include pressure, temperature, saturation, permeability, porosity, etc.

A solver block 250 may provide for solving a linearized system of equations (e.g., a system of linear equations), for example, for a particular time. As an example, a solver block 250 may implement a CPR method per the CPR method block 260 (see, e.g., Wallis "Incomplete Gaussian Elimination for Preconditioning of Generalized Conjugate Gradient Acceleration," SPE Reservoir Simulation Symposium, Nov. 15-18, 1983, SPE 12265). In the example of FIG. 2, the solver block 250 may iterate in an effort to reach one or more convergence criteria (e.g., acceptable error). Where time is involved, time may be incremented (e.g., via a time step) after convergence has been reached for a prior time.

As an example, a matrix may be ordered in a cell-by-cell manner where cells have associated unknowns. Such a matrix may include zero entries and nonzero entries. Size or shape of a block may be determined by cell neighbors or other relationships. Further, characteristics of a numerical technique may have an effect on one or more of block size, shape, etc. (e.g., order of a finite difference technique, etc.).

As to the multisegment well model 270, nodes and segment pipes are shown with respect to an example of a reservoir and a wellbore to model flow between the wellbore and the reservoir (e.g., via grid cells that model the reservoir). As shown in the example of FIG. 2, the multisegment well model 270 may provide for discretization of a well into a number of one-dimensional segments (e.g., lines) where each of the segments includes a node and a segment pipe. In the multisegment well model 270, a segment may include no connections to a reservoir grid cell or may include one or more connections to a reservoir grid cell. Such a model may provide for modeling three-phase black oil, for example, via mass conservation equations and a pressure drop equation associated with each well segment. As an example, well equations may be solved along with reservoir equations to give pressure, flow rates (e.g., mass flow rates, volume flow rates, velocities, etc.) and composition (e.g., phase composition, etc.) in each segment.

As an example, the multisegment well model 270 may be part of a well model specification of a framework such as the INTERSECT™ framework. As an example, such a well model specification may be adapted to model one or more natural fractures and optionally one or more artificial fractures. In such an example, one or more wells may be modeled in addition to one or more natural fractures, etc. For example, given a multisegment representation of a natural fracture, a segment may be introduced that mathematically links the natural fracture to a well. In such an example, a boundary condition or type of segment may exist to establish the mathematical link, for example, a Darcy segment of a porous natural fracture to a wellbore segment of a well (e.g., an open conduit for fluid flow). In such a manner, fluid communication can be modeled between a natural fracture and another entity in a multisegment model. As an example, segments may be introduced to form a 2D grid for a fracture (e.g., where the 2D grid may be mathematically linked to a 3D grid used for modeling a subterranean formation). For example, segments may form a plane that mathematically represents a fracture for purposes of modeling flow to the fracture, from the fracture and within the fracture. In such an example, flow may be for one or more fluids (e.g., liquid, gas, injection fluid, production fluid, etc.). As mentioned, flow may be in terms of mass flow rate, volumetric flow rate, velocity, etc.

Figure 3:
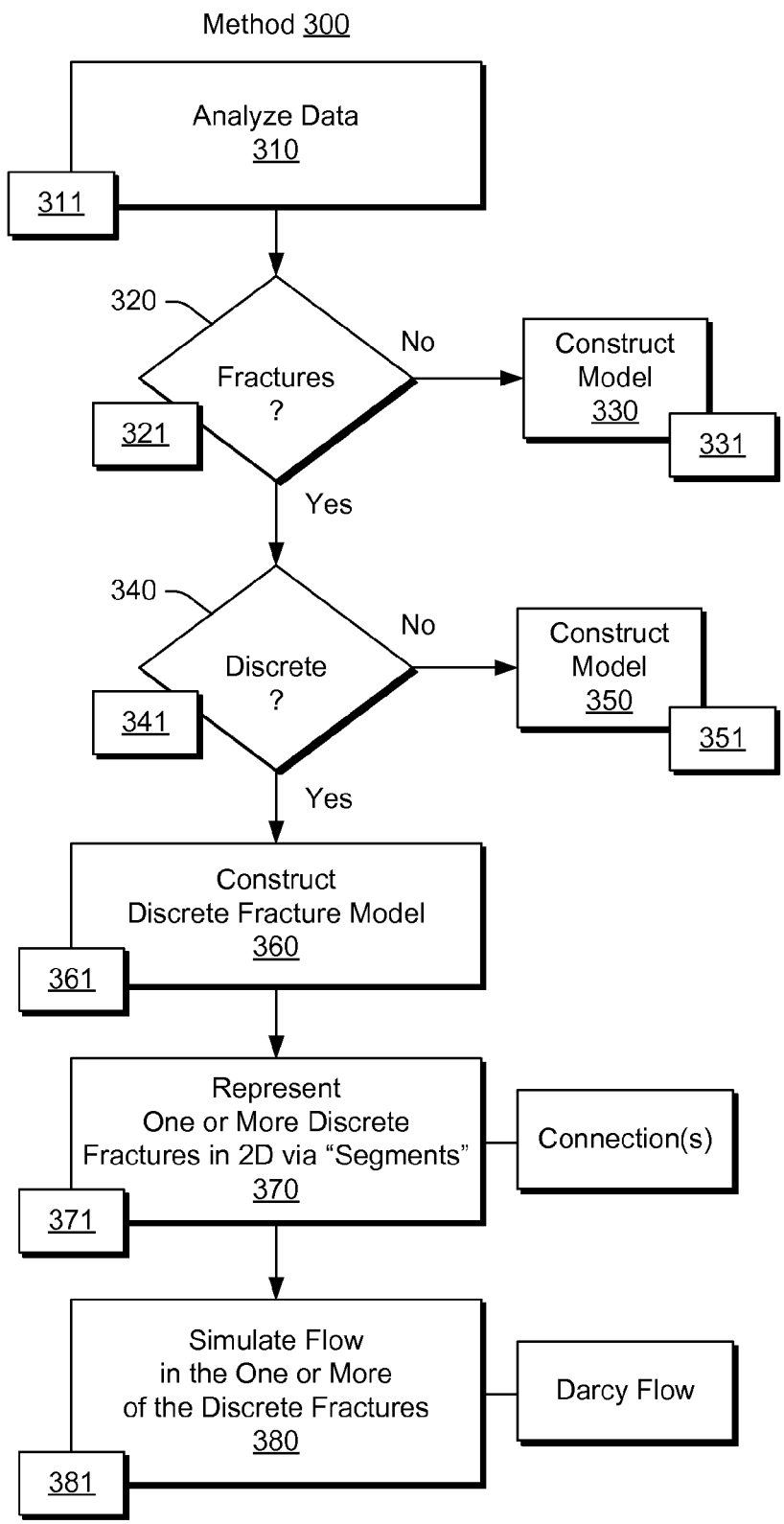
FIG. 3 illustrates an example of a method for modeling fractures.

FIG. 3 shows an example of a method 300, which may be a workflow, for example, for performance by a reservoir engineer, etc. The method 300 includes an analysis block 310 for analyzing data and a decision block 320 for deciding whether one or more fractures exist based at least in part on the analysis of data. Where the decision block 320 decides that no fractures exist, the method 300 continues to a construction block 330 for constructing a model, which may be, for example, a reservoir model (e.g., a model that includes a grid for modeling a three-dimensional subterranean region). In the method 300, where the decision block 320 decides that fractures exist, another decision block 340 decides whether at least some of the fractures exist as discrete fractures. For example, the decision block 340 may decide whether the analysis of data of the analysis block 310 provides sufficient information as to the existence of one or more discrete fractures that may be amenable to modeling using a multisegment model. Where the decision block 340 decides that no discrete fractures exist, the method 300 continues to a construction block 350 for constructing a model, which may include a continuum approach for modeling existence of fractures (e.g., small scale fractures that cannot be deemed "discrete" with respect to one or more criteria).

Where the decision block 340 decides that one or more discrete fractures exist, the method 300 continues to a construction block 360 for constructing a discrete fracture model. As shown in the example of FIG. 3, the method 300 can include constructing a discrete fracture model via a representation block 370 for representing one or more discrete fractures in 2D via segments and optionally representing at least one of the segments as including one or more connections. Given a discrete fracture model, the method 300 can include a simulation block 380 for simulating flow in the one or more discrete fractures. In such an example, simulation of flow may include simulation of Darcy flow (e.g., where one or more of the segments of a multisegment model include equations that describe Darcy flow).

As an example, a simulation may simulate a state of a system. For example, a relatively steady-state may exist for a subterranean formation where one or more natural fractures act to store fluid of a reservoir. In such an example, a simulation may simulate a storage state that provides information as to whether one or more natural fractures store fluid or not. As an example, such a simulation may not involve intermediate timesteps in reaching the steady-state. As an example, given a steady-state solution, a well, artificial fracture, etc., may be introduced to a multisegment model and a simulation performed to model flow, for example, from a well to a natural fracture, from an artificial fracture to a natural fracture, from a reservoir to a natural fracture, etc. As an example, a well may be a producer well, an injector well, or other type of well.

The method 300 is shown in FIG. 3 in association with various computer-readable media (CRM) blocks 311, 321, 331, 341, 351, 361, 371 and 381. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 300. As an example, a computer-readable medium (CRM) may be a computer-readable storage medium.

Figure 4:
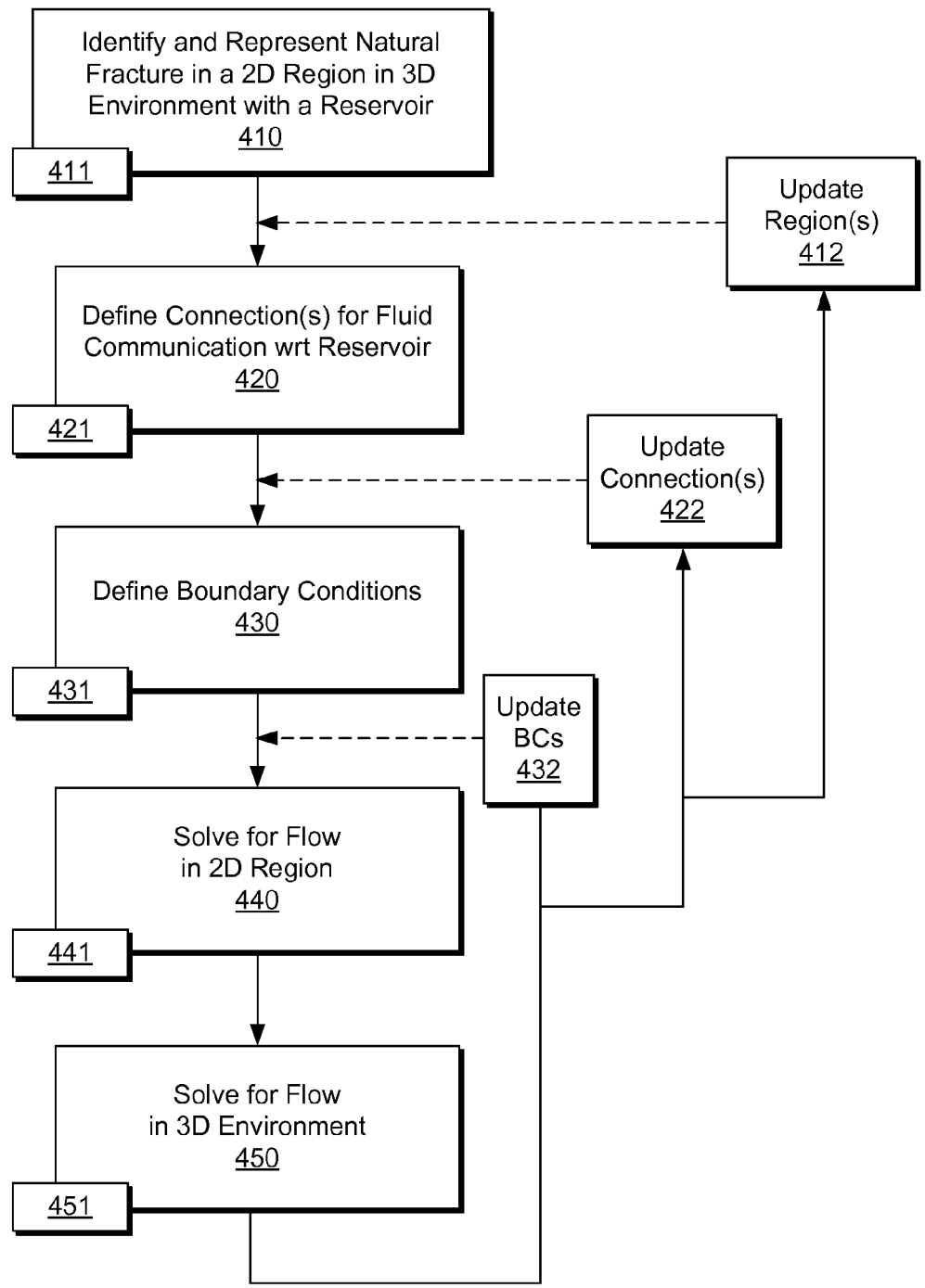
FIG. 4 illustrates an example of a method for modeling fractures in an environment.

FIG. 4 shows an example of a method 400 that includes an identification and representation block 410 for identifying and representing a natural fracture in a 2D region in a 3D environment with a reservoir, a definition block 420 for defining one or more connections for fluid communication between the 2D region and the reservoir of the 3D environment, a definition block 430 for defining boundary conditions as to at least the 2D region (e.g., consider a zero rate condition for a natural fracture as being associated with a reservoir), a solution block 440 for solving for flow in the 2D region (e.g., subject to the boundary conditions), and a solution block 450 for solving for flow in the 3D environment based at least in part on a solution provided by the solution block 440 for flow in the 2D region.

As indicated in the example of FIG. 4, a solution of the solution block 450 can inform an update block 412 for updating one or more regions, an update block 422 for updating one or more connections, and an update block 432 for updating one or more boundary conditions. In such a manner, one or more loops may exist that act to examine spatial variations, property variations, etc. As an example, one or more loops may act to refine a solution or solutions, for example, to more accurately model flow in a 3D environment that includes at least one 2D region, which may represent a natural fracture.

In the example of FIG. 4, a 2D region may be a multisegment region where multiple segments represent a natural fracture. As an example, the method 400 may include representing entities such as wells, artificial fractures, etc. In such an example, the blocks 420 and 430 may provide for appropriate connections and boundary conditions, respectively.

The method 400 is shown in FIG. 4 in association with various computer-readable media (CRM) blocks 411, 421, 431, 441 and 451. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 400. As an example, a computer-readable medium (CRM) may be a computer-readable storage medium.

As an example, a method can include identifying a discrete natural fracture in a three-dimensional environment that includes a reservoir, the subterranean formation and the reservoir modeled by a three-dimensional grid model; representing the discrete natural fracture via a multisegment model in a two-dimensional region within the three-dimensional grid model; defining at least one connection for fluid communication between the multisegment model and the three-dimensional grid model; defining boundary conditions for the multisegment model; and solving the multisegment model subject to the at least one connection and the boundary conditions to provide values for fluid flow in the two-dimensional region. As an example, such a method may include solving for the three-dimensional grid model for fluid flow based at least in part on the values for fluid flow in the two-dimensional region.

As an example, a method can include defining at least one connection for fluid communication between a multisegment model and a well, the well modeled by another multisegment model. Such a method may also include solving the multisegment models to provide values for fluid flow in at least a two-dimensional region.

As an example, a method can include formulating a plan for creation of an artificial fracture based at least in part on values for fluid flow in a two-dimensional region that represents a natural fracture. As an example, a method can include representing an artificial fracture via a multisegment model in a two-dimensional region within a three-dimensional grid model and solving multiple multisegment models to provide values for fluid flow two-dimensional regions.

As an example, a method can include defining at least one connection for fluid communication between a multisegment model and a three-dimensional grid model by defining a connection for fluid communication between a discrete natural fracture and a reservoir. In such an example, the reservoir can include fluid and values for fluid flow in a two-dimensional region may represent flow of fluid from the reservoir to the discrete natural fracture, from the discrete natural fracture to the reservoir or a combination of both.

As an example, a three-dimensional grid model may account for at least some fractures in a three-dimensional environment using a continuum model. In such an example, other fractures may be considered discrete and modeled using a multisegment model or models.

Figure 5:
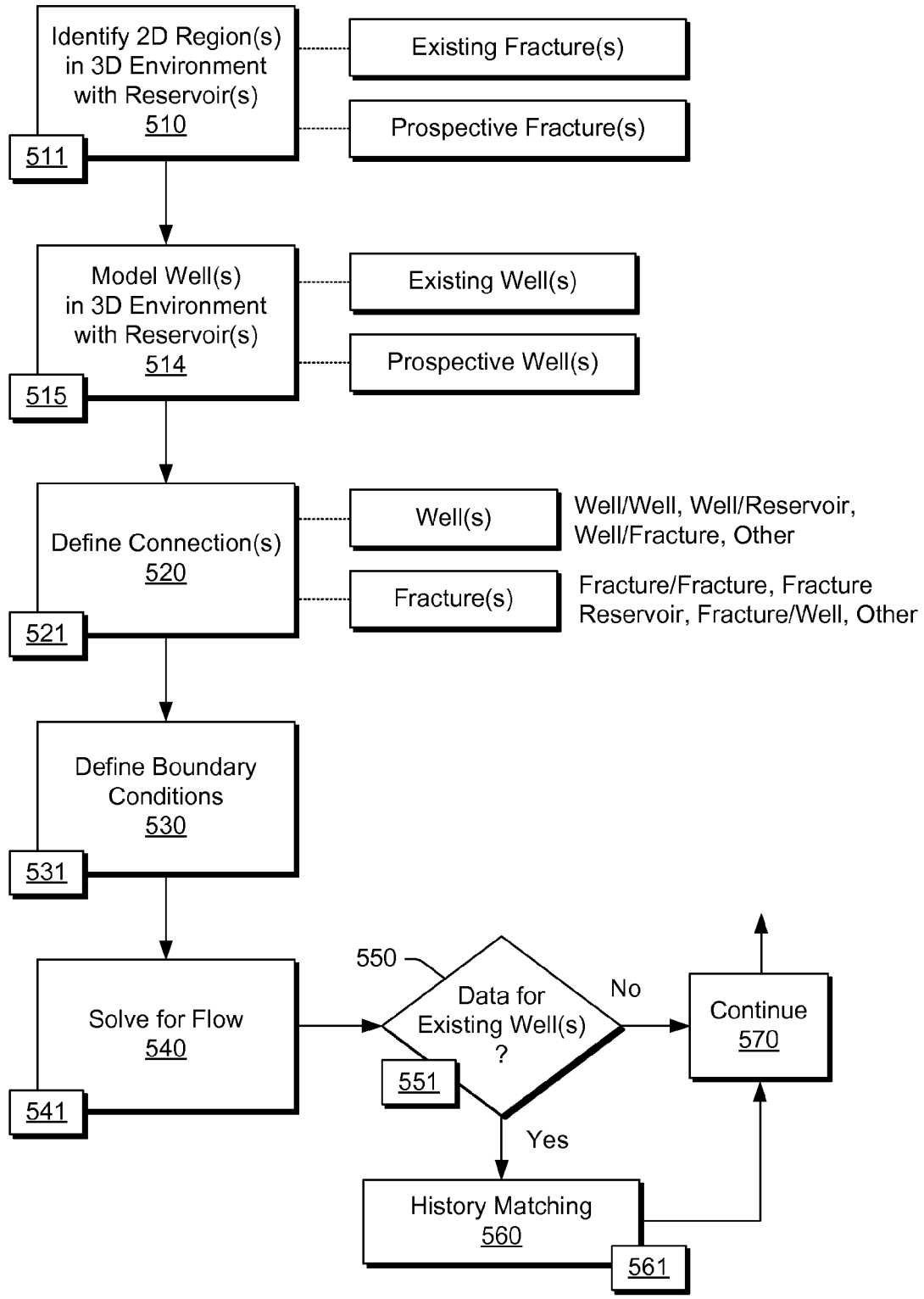
FIG. 5 illustrates an example of a method for modeling fractures and wells in an environment.

FIG. 5 shows an example of a method 500 that includes an identification block 510 for identifying one or more 2D regions in a 3D environment with one or more reservoirs, a model block 514 for modeling one or more wells in the 3D environment with one or more reservoirs, a definition block 520 for defining one or more connections of entities in the 3D environment (e.g., wells, fractures, reservoirs, etc.), a definition block 530 for defining boundary conditions for at least some of the entities in the 3D environment, and a solution block 540 for solving for flow (e.g., subject to the boundary conditions).

As an example, a 2D region may be a multisegment region that represents an existing fracture (e.g., natural or artificial or a hybrid thereof), a prospective fracture, etc. As to the model block 514, modeling may be for an existing well, a prospective well, a modification to an existing well, etc. As an example, a multisegment model may include at least one natural fracture and at least one well, whether existing, prospective, etc.

In the example of FIG. 5, the method 500 includes a decision block 550 for deciding whether data exist for one or more existing wells. As an example, where the decision block 550 decides that such data exists, the method 500 may continue to a history matching block 560 for performing history matching (e.g., to compare a solution of the solution block 540 to data). Thereafter, the method 500 may continue at a continuation block 570, which may continue to a loop action or other action. As an example, where the decision block 550 decides that sufficient data does not exist (e.g., for purposes of history matching), the method 500 may continue to the continuation block 570.

The method 500 is shown in FIG. 5 in association with various computer-readable media (CRM) blocks 511, 515, 521, 531, 541, 551 and 561. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 500. As an example, a computer-readable medium (CRM) may be a computer-readable storage medium.

Figure 6:
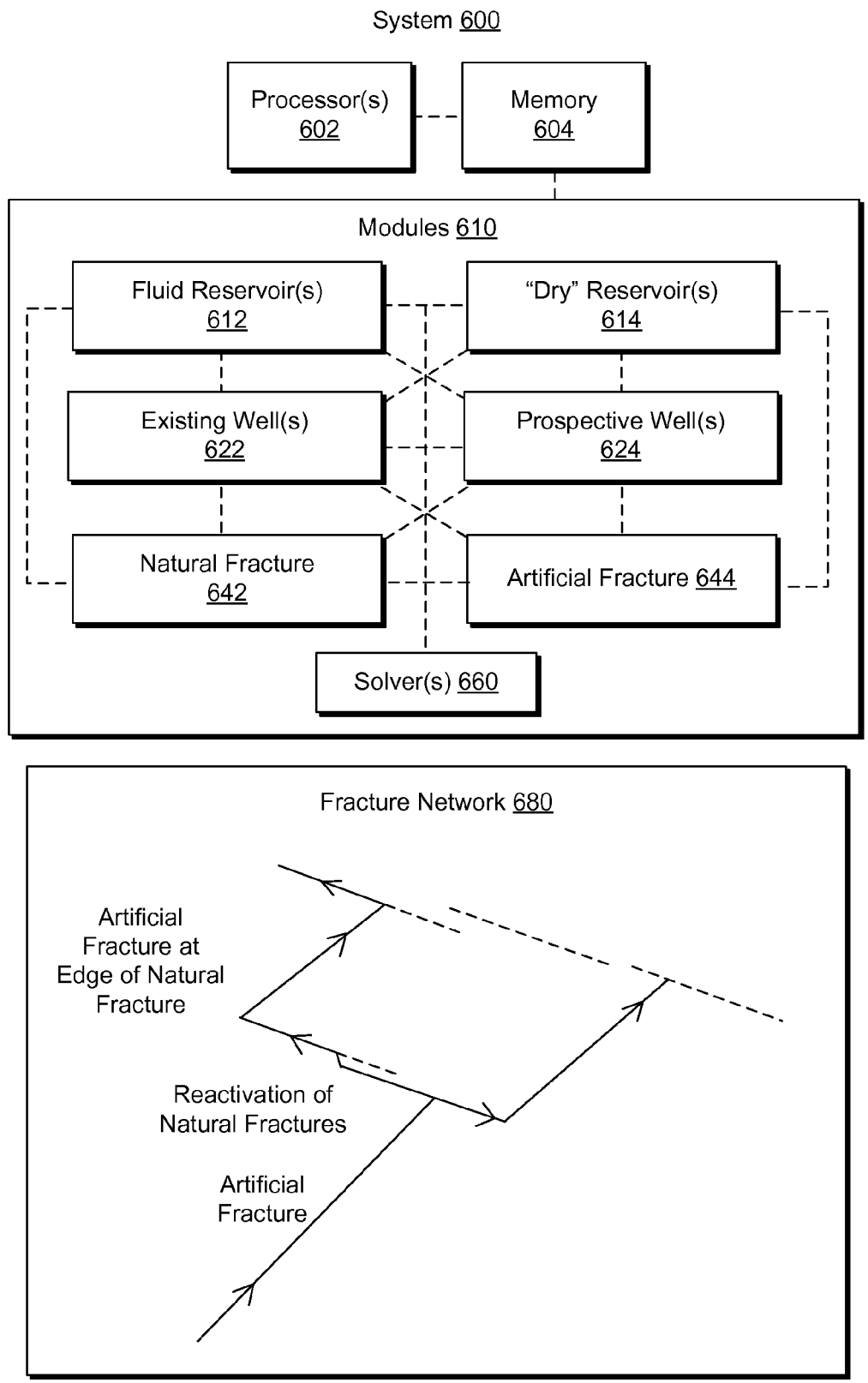
FIG. 6 illustrates an example of a system, examples of modules and an example of a fracture network.

FIG. 6 shows an example of a system 600, examples of various modules 610 and an example of a fracture network 680. In the example of FIG. 6, the system 600 includes one or more processors 602 operatively coupled to memory 604. As an example, the memory 604 may store modules such as one or more of the modules 610, which may provide for modeling storage, flow, etc., in a subterranean environment. In the example of FIG. 6, the modules 610 include a fluid reservoir module 612, a dry reservoir module 614, a module for existing wells 622, a module for prospective wells 624, a natural fracture module 642, an artificial fracture module 644 and one or more solver modules 660. In the example of FIG. 6, the modules 610 may include instructions suitable for execution by one or more of the processors (e.g., processor cores) to instruct a computing device or system to perform one or more actions. For example, the system 600 may be instructed by instructions of one or more of the modules 610.

As an example, a method can include implementing one or more of the module 610 to represent a network such as the fracture network 680. In the example of FIG. 6, the fracture network 680 includes natural fractures and artificial fractures. As an example, creation of a hydraulic fracture may be impacted by one or more natural fractures. For example, hydraulic fracture growth may proceed in a northeast-southwest direction that reactivates natural fractures (dashed lines) trending in another direction or directions (see, e.g., arrows indicate possible propagation directions of hydraulic fractures).

As an example, a method can include modeling of natural fractures in an environment using a multisegment model and solving the multisegment model for storage, flow, etc., for example, with respect to a reservoir or reservoirs. In turn, a solution may be analyzed for prospective artificial fractures. Such an analysis may, for example, include positioning of one or more wells for creating one or more prospective artificial fractures with respect to one or more natural fractures to generate a network that acts to reactivate natural fractures as conduits for flow of fluid. As an example, such an analysis may aim to avoid certain natural fractures and reactivate (e.g., utilize) other natural fractures. In such an example, refinement of natural fracture locations, properties, etc., may occur using a multisegment model optionally in conjunction with a 3D grid model that models one or more reservoirs.

As an example, a model may account for stress or one or more other factors that may relate to fracturing. As an example, a multisegment natural fracture model may be mathematically linked to a stress model for a 3D environment. As an example, a model may account for a chemical process (e.g., acidizing). As an example, a multisegment natural fracture model may be mathematically linked to a chemical reaction model for modeling a chemical process (e.g., with respect to one or more fracture characteristics). Where history matching is performed for flow based at least in part on a solution to a multisegment natural fracture model, refinements to the multisegment natural fracture model may act to update one or more parameters associated with stress (e.g., direction, etc.).

As an example, a system can include one or more processors for processing information, memory operatively coupled to the one or more processors and modules that include instructions storable in the memory and executable by at least one of the one or more processors. Such modules may include a reservoir module for modeling a reservoir in a subterranean three-dimensional environment via a three-dimensional grid model, a natural fracture module for modeling a natural fracture via a multisegment model in a two-dimensional region, a well module for modeling a well via a multisegment model, and one or more solver modules for solving for values of fluid flow in a fracture network based at least in part on modeling a natural fracture via a multisegment model. As an example, a system may include an artificial fracture module for modeling an artificial fracture via a multisegment model in a two-dimensional region. As an example, a system may include a solver module for solving for values of fluid flow in a fracture network that includes at least one natural fracture and at least one artificial fracture.

Figure 7:
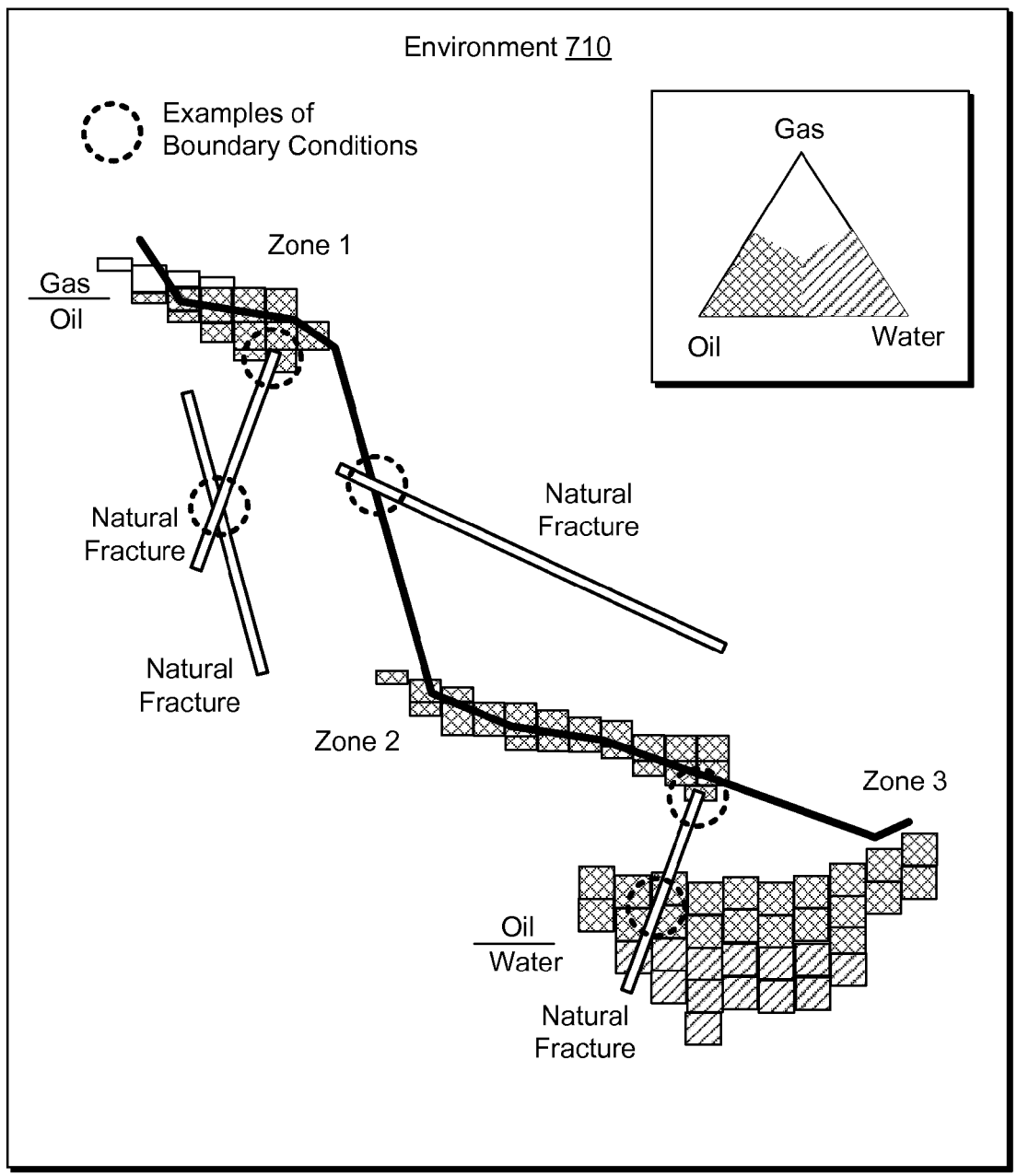
FIG. 7 illustrates an example of an environment that includes one or more natural fractures.

As mentioned, boundary conditions may be defined (e.g., imposed) on one or more segments of a multisegment model that models a natural fracture, natural fractures, etc. FIG. 7 shows an example of an environment 710 that includes various formations, a wellbore and natural fractures. As indicated, the formations include fluid such as oil, gas and/or water, which may define various zones. As to boundary conditions, a natural fracture may include a natural fracture to natural fracture boundary condition, a natural fracture to oil filled formation boundary condition, a natural fracture to wellbore boundary condition, a natural fracture to a gas-filled formation boundary condition, a natural fracture to a water filled formation boundary condition, etc. As an example, a natural fracture may include multiple boundary conditions, for example, for both a wellbore and a fluid filled formation.

As an example, a formation may be considered fluid filled or void (e.g., "dry") depending on type of fluid. For example, a gas filled formation may be considered void with respect oil where a goal is to produce oil. As indicated by the example environment 710 of FIG. 7, oil and water may coexist within a formation and a strategy may be formulated to produce oil with minimal water content. As an example, such a strategy may be honed via use of a multisegment that models one or more natural fractures with respect to an environment (e.g., to avoid activation of a natural fracture that may lead to increase of water content in oil).

Figure 8:
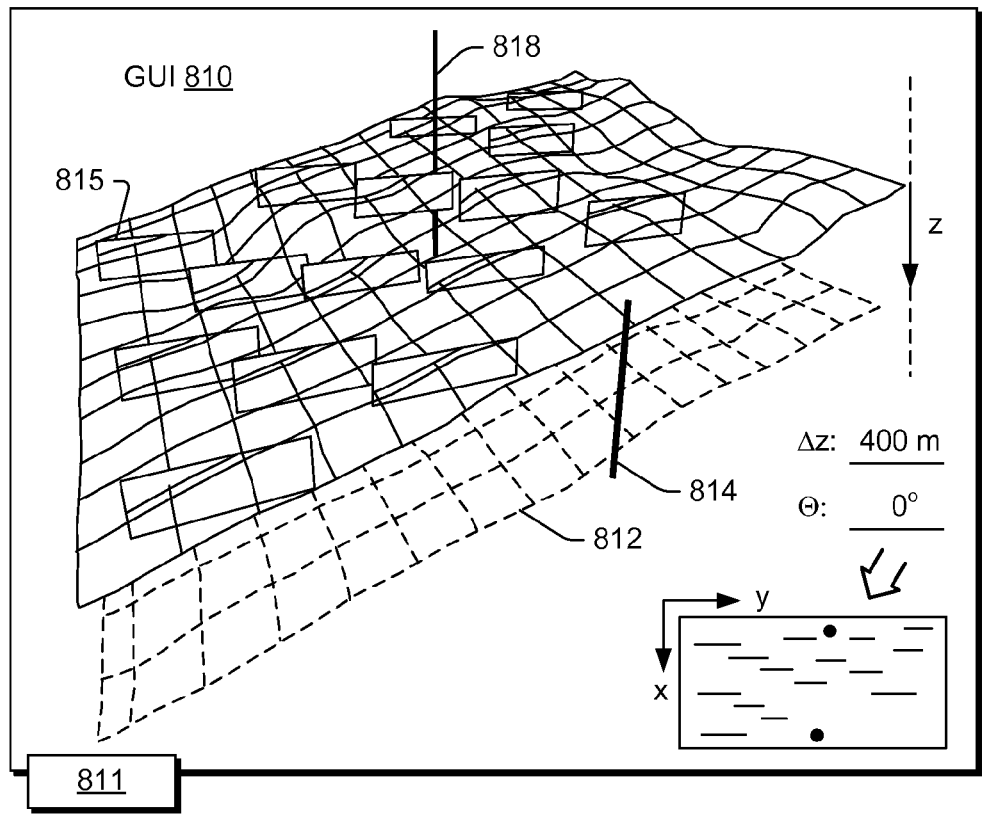
FIG. 8 illustrates examples of graphical user interfaces.
Figure 8:
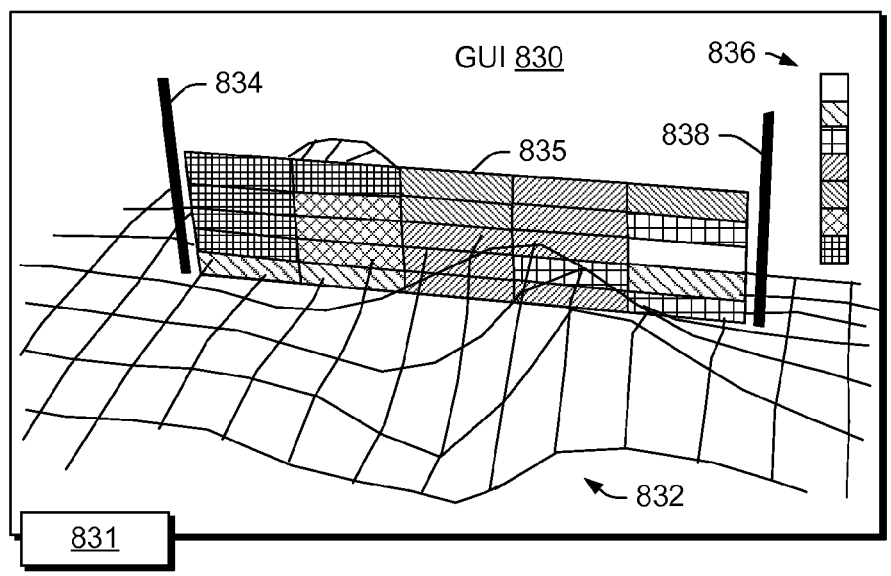

FIG. 8 shows an example of a graphical user interface (GUI) 810 that provides for display of a grid 812, wells 814 and 818 and fractures 815 and an example of a GUI 830 that provides for display of a grid 832, wells 834 and 838, a fracture 835 and a scale 836.

As to the GUI 810, it may also provide for viewing the various entities in another view such as a plan view in an x,y-plane. The GUI 810 may include one or more data fields, for example, for input of parameters associated with fractures 815. For example, a fracture field depth may be specified along a depth dimension and a fracture field orientation may be specified with respect to a direction (e.g., optionally an angle). As mentioned, natural fractures may occur as clusters or corridors, which may be oriented in a general direction (e.g., responsive to past stress, etc.). In the example of FIG. 8, the GUI 810 may provide for orienting a field as whole or individual fractures within a cluster or corridor.

As to the GUI 830, the natural fracture 835 is represented as a 2D grid along with various values, which may be properties assigned to the 2D grid, solutions to a model for the 2D grid, etc. For example, the various values as indicated by the scale 836 may represent static properties (e.g., permeability, etc.), dynamic values (e.g., from a simulation, etc.). As an example, a GUI may present pressure values, saturation values (e.g., percentage of a phase in a multiphase fluid system), porosity values, flow values or other values associated with a Darcy model or other model. Such values may be presented directly on a 2D grid. As an example, a GUI may include a graphic control that for allows for selection of one or more types of values and display of such values (e.g., using color, hatching, contours, etc.) with respect to a grid that represents a fracture. In such a manner, a user may interact with the GUI to visualize values to determine a strategy, hone a strategy, update a model, etc. As an example, a visualization may be presented as a series of images with respect to time (e.g., a movie), for example, to illustrate flow, change in one or more properties, phase composition, etc. with respect to time.

As an example, the 2D grid may include 25 or more segments, which may be Darcy segments where each Darcy segment includes property values. In such an example, boundary conditions may be specified for at least some of the segments. For example, where the well 834 connects to the fracture 835, the segments along that boundary may include appropriate boundary conditions. As another example, where the well 838 connects to the fracture 835, the segments along that boundary may include appropriate boundary conditions.

As an example, the well 834 may be specified to be a producer well while the well 838 may be specified to be an injector well. In such an example, a multisegment model may model fluid flow in the fracture 835 (e.g., the 2D grid) given conditions as to injection of fluid via the injector well 838. In such an example, the fracture 835 may include boundary conditions that avoid movement of fluid to the surface (e.g., one or more boundaries).

As an example, the natural fracture 835 may include one or more boundary conditions that mathematically link it to a reservoir modeled by the 3D grid 832. As an example, where the well 838 is specified to be an injector well, it may inject a fluid such as water that causes movement of oil from an oil reservoir in fluid communication with the natural fracture 835 to flow to the well 834, which may be specified to be a producer well. In such an example, the 2D grid may be displayed in the GUI 830 to indicate presence of a fluid, a fluid phase, fluid pressure, fluid flow, etc.

The GUIs 810 and 830 are shown in FIG. 8 in association with various computer-readable media (CRM) blocks 811 and 831. Such blocks generally include instructions suitable for execution by one or more processors (or processor cores) to instruct a computing device or system to perform one or more actions. While various blocks are shown, a single medium may be configured with instructions to allow for, at least in part, performance of various actions associated with rendering the GUIs 810 and 830. As an example, a computer-readable medium (CRM) may be a computer-readable storage medium.

Figure 9:
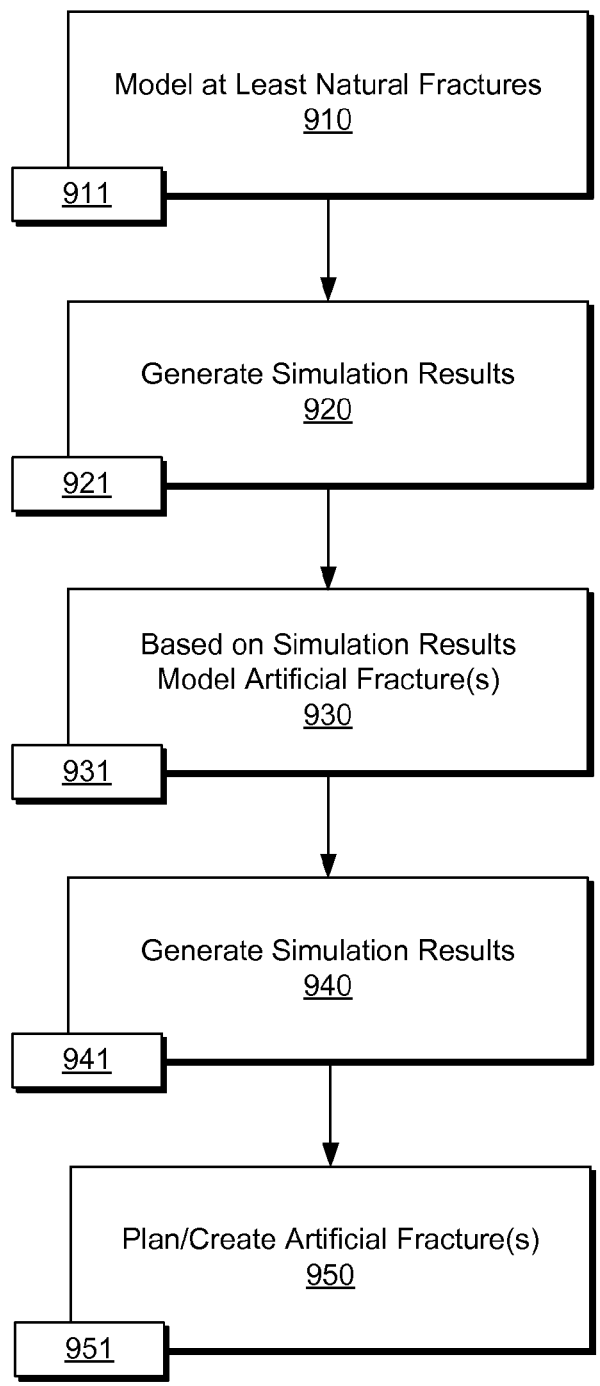
FIG. 9 illustrates an example of a method.

FIG. 9 shows an example of a method 900 that includes a model block 910 for modeling at least natural fractures, a generation block 920 for generating simulation results for at least the natural fractures, a model block 930 for modeling artificial fractures based at least in part on the simulation results, a generation block 940 for generating simulation results for at least the artificial fractures and a plan block 950 for planning for or creating one or more artificial fractures based at least in part on the simulation results (e.g., for at least the natural fractures, for at least the artificial fractures, etc.).

The method 900 is shown in FIG. 9 in association with various computer-readable media (CRM) blocks 911, 921, 931, 941 and 951. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 900. As an example, a computer-readable medium (CRM) may be a computer-readable storage medium.

Figure 10:
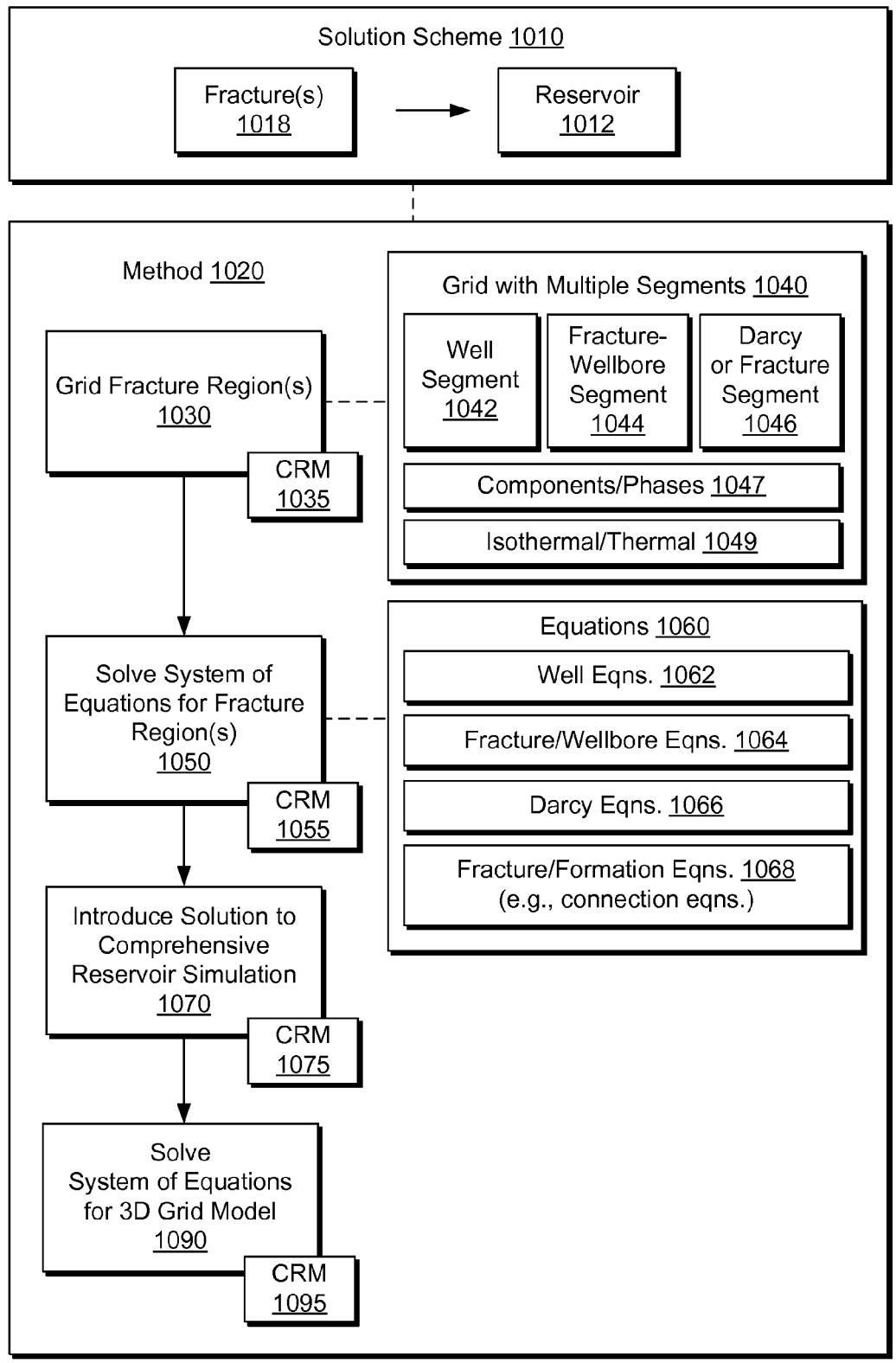
FIG. 10 illustrates an example of a solution scheme and an example of a method.

FIG. 10 shows an example of a solution scheme 1010 and an example of a method 1020. The solution scheme 1010 includes providing solution results for a fracture model 1018 to a reservoir model 1012. In the example of FIG. 10, the method 1020 pertains to the solution scheme 1010. In a grid block 1030, the method 1020 grids one or more fracture regions (e.g., to form one or more networks). For example, the block 1030 may grid one or more regions with multiple segments 1040 where each segment may be a Darcy (or fracture) segment 1046 or optionally another type of segment (e.g., well segment 1042, a fracture-wellbore segment 1044, etc.).

As shown in the example of FIG. 10, the method 1020 includes a solution block 1050 for solving a system of equations for fracture regions. The system of equations 1060 may include, for example, well equations 1062, fracture/well equations 1064, Darcy equations 1066 and fracture/formation equations 1068 (e.g., connection equations). As an example, formulated equations for various phenomena in a fracture system may be solved simultaneously to convergence. A solution to such a system of equations may be by itself of use for field management or other management purposes.

In the example of FIG. 10, the method 1020 includes an introduction block 1070 for introducing a solution to a fracture model to a comprehensive reservoir simulation (e.g., in accord with the solution scheme 1010). The method 1020 also includes a solution block 1090 for solving the comprehensive reservoir simulation, for example, as modeled using a three-dimensional grid.

The method 1020 also shows circuitry or computer-readable medium blocks 1035, 1055, 1075 and 1095, which may be physical components (e.g., actual circuitry, storage devices, combinations thereof, etc.) configured to perform actions of their corresponding method blocks 1030, 1050, 1070 and 1090.

As an example, one or more computer-readable storage media can include computer-executable instructions to instruct a computing system to: grid one or more natural fracture regions with respect to a three-dimensional grid model of a subterranean formation that comprises a reservoir, the one or more natural fracture regions represented via multiple segments; solve a system of equations associated with the multiple segments to provide a solution; introduce the solution as input to a system of equations associated with the three-dimensional grid model; and solve the system of equations associated with the three-dimensional grid model. In such an example, one or more computer-readable media may include computer-executable instructions to instruct a computing system to grid the one or more natural fracture regions for individual natural fractures of a natural fracture corridor.

As an example, one or more computer-readable media may include computer-executable instructions to instruct a computing system to render representations of the natural fracture corridor to a display. In such an example, instructions may be included to instruct a computing system to render graphical controls to the display for receipt of commands to orient the natural fracture corridor with respect to the three-dimensional of the subterranean formation.

Figure 11:
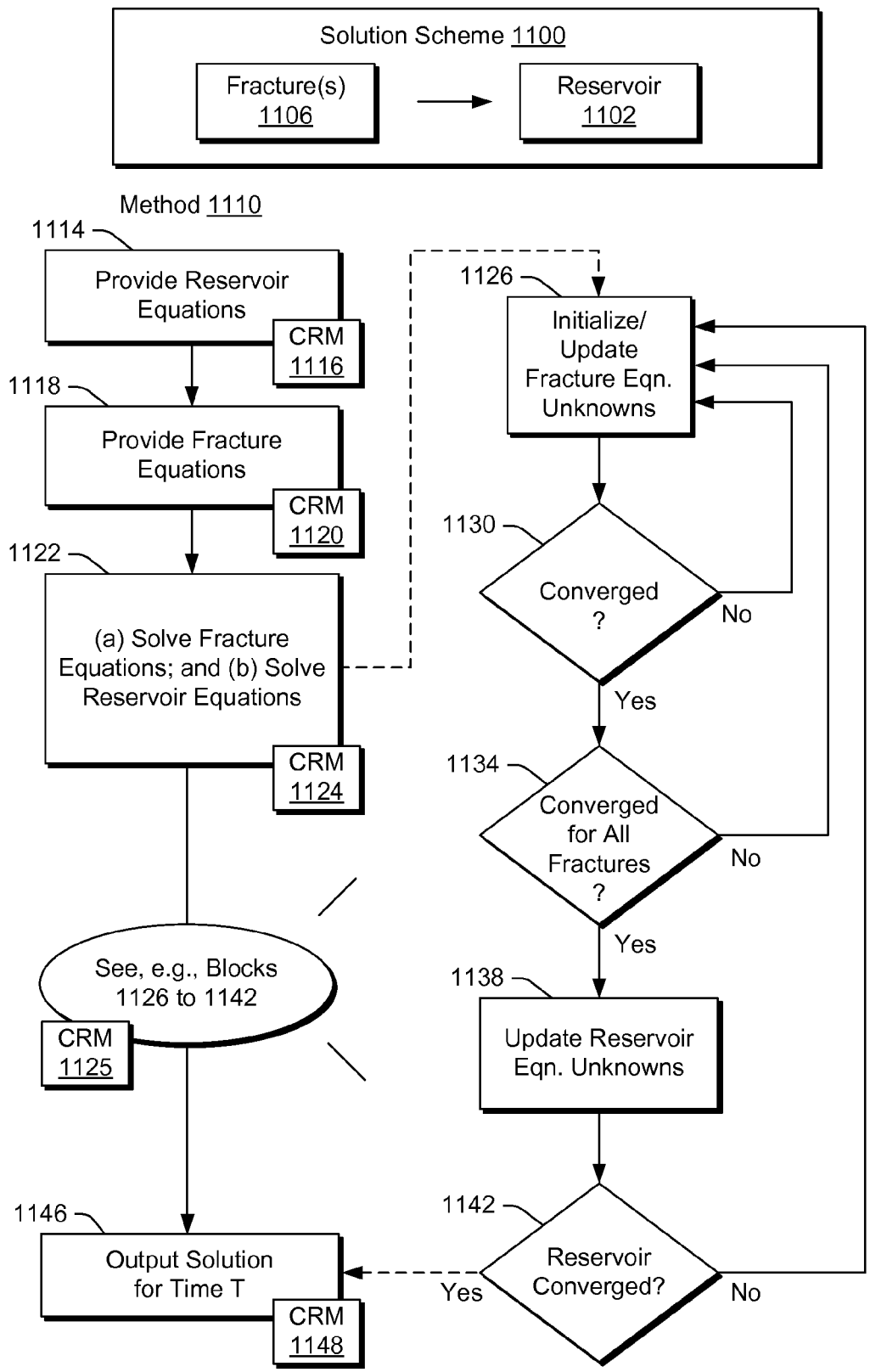
FIG. 11 illustrates an example of a solution scheme and an example of a method.

FIG. 11 shows an example of a solution scheme 1100 and an example of a method 1110. The solution scheme 1100 includes providing a fracture model that models one or more fractures 1106, for example, as a network or networks. The scheme 1100 provides for solving the fracture model and introducing the result to a model that models a reservoir 1102.

In the examples of FIG. 11, a set of fracture equations can be solved together and independently of a set of reservoir grid cell equations for each nonlinear iteration of a combined system of reservoir and fracture equations. From a reservoir grid solution viewpoint, such an approach has the effect of solving the reservoir system given a locally converged solution of at least one fracture system and optionally multiple fracture systems associated with a reservoir.

The method 1110 includes a provision block 1114 that provides reservoir equations and a provision block 1118 that provides fracture equations. A solution block 1122 includes (a) solving the fracture equations followed by (b) solving reservoir equations. An example of an approach for performing various actions of block 1122 is presented with respect to blocks 1126 to 1142. Thereafter, the method 1110 provides, per an output block 1146, a solution for a time "T".

In the example of FIG. 11, the solution block 1122 can implement nested loops that act to converge solutions to various equations. An outer loop acts to converge a solution to reservoir equations via a decision block 1142, an inner loop acts to converge a solution to equations for fractures via a decision block 1134, and an innermost loop acts to converge a solution to equations for a particular fracture system via a decision block 1130. Accordingly, the blocks 1126 to 1142 can begin with initialization of fracture equations per block 1126 (e.g., optionally based on output from a reservoir model simulator), followed by converging solutions for each particular fracture system and then globally converging the solutions for multiple fracture systems. After convergence of fracture systems, an update block 1138 may update unknowns for reservoir equations (e.g., independent variables). A simulator may solve the reservoir equations by a technique that iterates values of the unknowns until convergence. Once converged, the result may be output per the output block 1146. Such a result aims to include a global solution for a reservoir including associated fracture systems.

FIG. 11 also shows various computer-readable media blocks (CRM) 1116, 1120, 1124, 1125 and 1148, which correspond to method blocks 1114, 1118, 1122 and 1146, respectively. While blocks are shown individually, a single computer-readable may include instructions of blocks 1116, 1120, 1124, 1125 and 1148.

Figure 12:
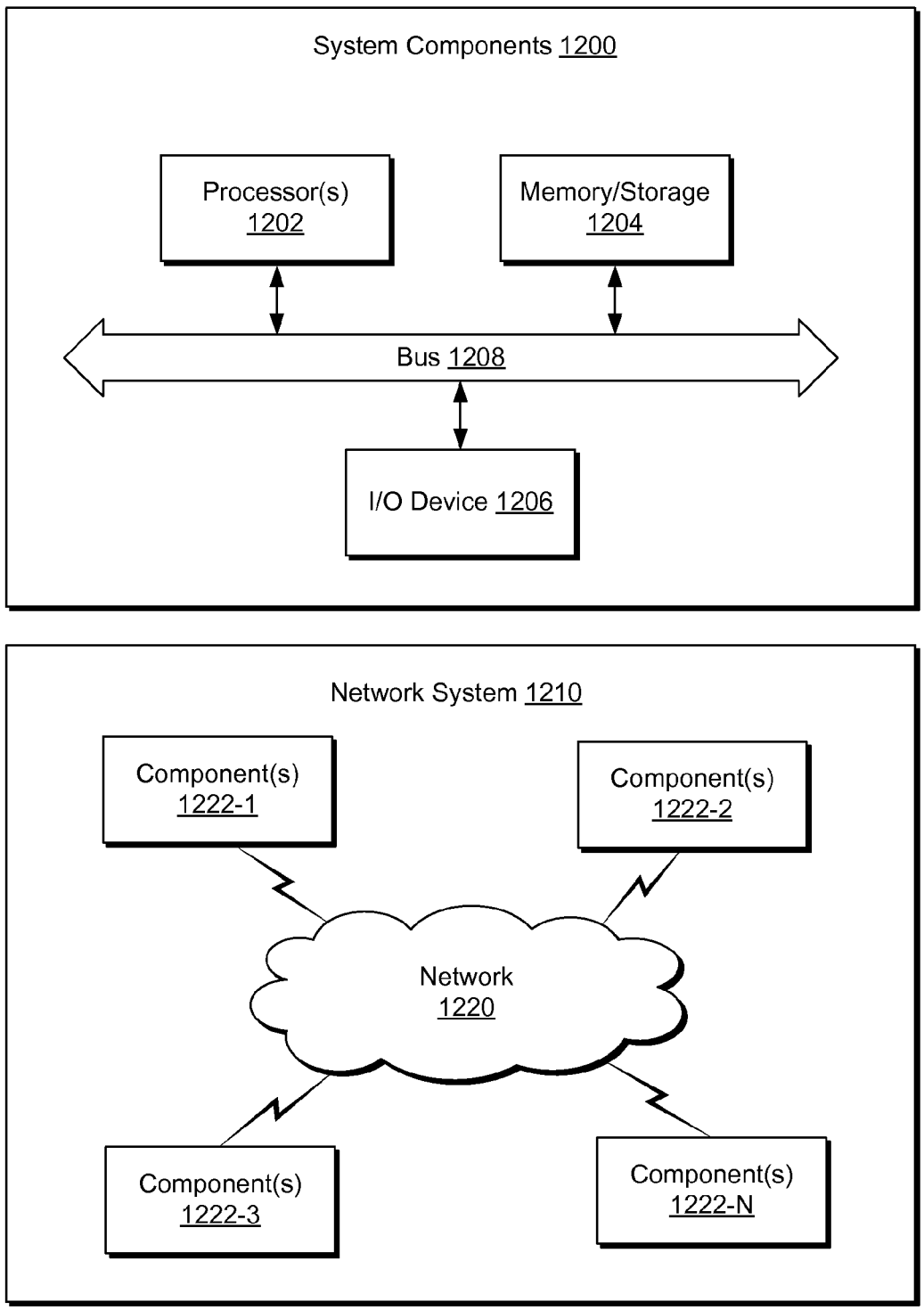
FIG. 12 illustrates example components of a system and a networked system.

FIG. 12 shows components of an example of a computing system 1200 and an example of a networked system 1210. The system 1200 includes one or more processors 1202, memory and/or storage components 1204, one or more input and/or output devices 1206 and a bus 1208. In an example embodiment, instructions may be stored in one or more computer-readable media (e.g., memory/storage components 1204). Such instructions may be read by one or more processors (e.g., the processor(s) 1202) via a communication bus (e.g., the bus 1208), which may be wired or wireless. The one or more processors may execute such instructions to implement (wholly or in part) one or more attributes (e.g., as part of a method). A user may view output from and interact with a process via an I/O device (e.g., the device 1206). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1210. The network system 1210 includes components 1222-1, 1222-2, 1222-3, . . . 1222-N. For example, the components 1222-1 may include the processor(s) 1202 while the component(s) 1222-3 may include memory accessible by the processor(s) 1202. Further, the component(s) 1202-2 may include an I/O device for display and optionally interaction with a method. The network may be or include the Internet, an intranet, a cellular network, a satellite network, etc.

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. §112, paragraph 6 for any limitations of any of the claims herein, except for those in which the claim expressly uses the words "means for" together with an associated function.

What is claimed is:

1. A method comprising:
   identifying a discrete natural fracture in a three-dimensional graphical environment within a graphical user interface,
     wherein the three-dimensional graphical environment comprises a three-dimensional grid model representing a reservoir located in a subterranean formation, and
     wherein the three-dimensional graphical environment further comprises a multisegment model representing the discrete natural fracture in a first two-dimensional region within the three-dimensional graphical environment;
   defining at least one connection for a fluid communication linking, within the three-dimensional graphical environment, the multisegment model to the three-dimensional grid model;
   defining boundary conditions for the multisegment model; and
   solving the multisegment model subject to the at least one connection for the fluid communication and the boundary conditions to provide values for fluid flow in the first two-dimensional region.

2. The method of claim 1 further comprising solving for the three-dimensional grid model for fluid flow based at least in part on the values for the fluid flow in the first two-dimensional region.

3. The method of claim 1 wherein the multisegment model comprises segments that comprise associated equations for modeling fluid flow according to Darcy's law.

4. The method of claim 1 wherein the values for the fluid flow in the first two-dimensional region comprise values for multiphase fluid flow.

5. The method of claim 1 further comprising defining at least one connection for fluid communication between the multisegment model and a well, the well modeled by a multisegment model.

6. The method of claim 5 further comprising solving the multisegment models to provide values for fluid flow in at least the first two-dimensional region.

7. The method of claim 1 further comprising formulating a plan for creation of an artificial fracture based at least in part on the values for the fluid flow in the first two-dimensional region.

8. The method of claim 1 further comprising representing an artificial fracture via a multisegment model in a second two-dimensional region within the three-dimensional grid model and solving the multisegment models to provide values for the fluid flow in the first two-dimensional region and the second two-dimensional region.

9. The method of claim 1 wherein the defining at least one connection for fluid communication comprises defining a connection for fluid communication between the discrete natural fracture and the reservoir.

10. The method of claim 9 wherein the reservoir comprises fluid and wherein the values for the fluid flow in the two-dimensional region represent flow of the fluid from the reservoir to the discrete natural fracture.

11. The method of claim 9 wherein the reservoir comprises fluid and wherein the values for the fluid flow in the two-dimensional region represent flow of the fluid from the discrete natural fracture to the reservoir.

12. The method of claim 1 wherein the three-dimensional grid model accounts for at least some fractures in the three-dimensional environment using a continuum model.

13. A system comprising:
one or more processors for processing information;
memory operatively coupled to the one or more processors; and
modules that comprise instructions stored in the memory and executable by at least one of the one or more processors, wherein the modules comprise:
a reservoir module for rendering, in a three-dimensional graphical environment within a graphical user interface, a reservoir in a subterranean formation via a three-dimensional grid model,
a natural fracture module for rendering, in the three-dimensional graphical environment, a natural fracture via a first multisegment model in a first two-dimensional region, wherein the multi-segment model is linked, within the three-dimensional graphical environment, through a connection for a fluid communication to the three-dimensional grid model, a well module for modeling a well via a multisegment model, and
one or more solver modules for solving for values of fluid flow in a fracture network using the connection for the fluid communication.

14. The system of claim 13 comprising an artificial fracture module for modeling an artificial fracture via a second multisegment model in a second two-dimensional region.

15. The system of claim 14 wherein the one or more solver modules provide for solving for the values of the fluid flow in the fracture network that comprises at least one natural fracture and at least one artificial fracture.

16. One or more non-transitory computer-readable storage media comprising computer-executable instructions to instruct a computing system to:
grid, in a three-dimensional graphical environment using a graphical user interface, one or more natural fracture regions with respect to a three-dimensional grid model of a subterranean formation that comprises a reservoir, the one or more natural fracture regions represented via multiple segments;
define a connection for a fluid communication linking, within the three-dimensional graphical environment, one of the multiple segments in a two-dimensional region to the three-dimensional grid model;
solve, using the connection for the fluid communication, a system of equations associated with the multiple segments to provide a solution;
introduce the solution as an input to a system of equations associated with the three-dimensional grid model; and
solve the system of equations associated with the three-dimensional grid model.

17. The one or more non-transitory computer-readable media of claim 16 further comprising computer-executable instructions to instruct a computing system to grid the one or more natural fracture regions for individual natural fractures of a natural fracture corridor.

18. The one or more non-transitory computer-readable media of claim 17 further comprising computer-executable instructions to instruct a computing system to render representations of the natural fracture corridor to a display.

19. The one or more non-transitory computer-readable media of claim 18 further comprising computer-executable instructions to instruct a computing system to render graphical controls to the display for receipt of commands to orient the natural fracture corridor with respect to the three-dimensional of the subterranean formation.

* * * * *